United States Patent [19]

Tichy

[11] Patent Number: 4,630,342

[45] Date of Patent: Dec. 23, 1986

[54] METHOD OF MOUNTING A PIEZOELECTRIC HELMHOLTZ TRANSDUCER ON A PRINTED CIRCUIT BOARD

[75] Inventor: Thomas H. Tichy, Albuquerque, N. Mex.

[73] Assignee: Motorola, Inc., Schaumburg, Ill.

[21] Appl. No.: 838,441

[22] Filed: Mar. 10, 1986

Related U.S. Application Data

[63] Continuation of Ser. No. 684,879, Dec. 21, 1984, abandoned.

[51] Int. Cl.[4] .............................................. H01L 41/22
[52] U.S. Cl. ..................................... 29/25.35; 29/837; 29/840; 310/322
[58] Field of Search ............... 29/25.35, 840, 837–839; 310/322, 324; 179/110 A; 340/384 E

[56] References Cited

U.S. PATENT DOCUMENTS

| | | |
|---|---|---|
| 3,331,970 | 0/1967 | Dundon et al. . |
| 3,703,652 | 0/1972 | Noda . |
| 3,860,838 | 1/1975 | Kumon ................................. 310/322 |
| 3,873,866 | 0/1975 | Goble . |
| 3,970,879 | 7/1976 | Kumon ................................. 310/324 |
| 3,982,142 | 0/1976 | Goble . |
| 4,042,845 | 8/1977 | Hackett ................................. 310/322 |
| 4,330,729 | 5/1982 | Byrne ................................... 310/322 |
| 4,413,198 | 0/1983 | Bost . |
| 4,420,706 | 12/1983 | Siebold et al. .................. 310/322 X |
| 4,429,247 | 1/1984 | Feldman ............................. 310/322 |
| 4,456,848 | 6/1984 | Yasuda et al. ..................... 310/322 |

*Primary Examiner*—Carl E. Hall
*Attorney, Agent, or Firm*—Charles L. Warren; Donald B. Southard

[57] ABSTRACT

A helmholtz resonator is driven by a piezoelectric element and is suited for mounting to a printed circuit board. The resonator includes a resonant chamber defined by bottom, top, and side walls, and at least two ports that provide access to the chamber. The ports are contiguous to the bottom and side walls so that any liquid entering the chamber during the printed circuit board cleaning process can exit via the ports. This arrangement overcomes the contamination problem existing in prior art resonators having a single port.

2 Claims, 4 Drawing Figures

METHOD OF MOUNTING A PIEZOELECTRIC HELMHOLTZ TRANSDUCER ON A PRINTED CIRCUIT BOARD

This is a continuation of application Ser. No. 684,879, filed Dec. 21, 1984, now abandoned.

BACKGROUND OF THE INVENTION

This invention is generally directed to acoustic transducers which utilize a Helmholtz resonator driven by a piezoelectric element. More specifically, this invention is directed to an acoustic transducer of this type having a design which facilitates the removal of a liquid from the Helmholtz chamber. The ability to remove liquids and contaminates from the Helmholtz chamber is particularly important where the transducer is mounted to a printed circuit board (PCB) that will undergo conventional wave soldering and cleaning processes.

The use of piezoelectric elements including monomorph and bimorph benders in loudspeakers is known. The piezoelectric element converts an electrical signal representative of a desired sound into mechanical vibrations that result in the generation of sound.

In U.S. Pat. No. 4,413,198 issued to Jonathan Bost, a piezoelectric transducer apparatus is disclosed in which a piezoelectric driver element is simultaneously coupled to a first and second Helmholtz resonator. Each resonator is tuned to a different frequency and has a single output port disposed intermediate one wall of the resonator. Thus, the interior cavity of each Helmholtz resonator is accessible only by the single port.

A transducer including a piezoelectric driver element coupled to a Helmholtz resonator is disclosed in U.S. Pat. Nos. 3,873,866 and 3,982,142 issued to Ralph Goble. The Helmholtz resonator disclosed in these patents consists of an enclosed cylindrical chamber having a plurality of radially aligned circular holes formed in the cylindrical sidewall of the chamber. These holes are spaced apart from the top and bottom walls which define the Helmholtz chamber.

Piezoelectrically driven Helmholtz resonators designed for mounting to a PCB are available. These resonators are generally cylindrical and are mounted at one end to the PCB. A single aperture centered in the end of the transducer opposite the PCB provides a single tuned port for the Helmholtz chamber. Since the PCB is normally disposed in a horizontal plane during a wave soldering operation, the port faces generally upward. Thus, the opportunity exists during this operation for contaminates to enter the Helmholtz chamber via this port.

Following the wave soldering step, PCB's are normally immersed in or sprayed with a cleaning solution in order to remove flux and other residues which may have been deposited during the wave soldering operation. During this cleaning operation it is likely that the cleaning liquid will enter the Helmholtz chamber via the port. Once the cleaning solution or other contaminates enter the chamber, it is very difficult to remove such contaminates from the chamber. Even if the transducer and PCB are oriented such that the port faces down, the inherent vacuum which exists in the chamber with the port obscured by the cleaning liquid prevents, or at least inhibits, the flow of the liquid from the chamber.

One solution to this problem with Helmholtz chambers having a single port consists of placing a sticker over the port during the wave soldering and cleaning operations. This sticker which is secured by an adhesive must be removed from the transducer following the cleaning operation. This solution unfortunately creates other problems. A substantial amount of labor is required to properly position the sticker over the port and later remove the sticker. Also, the additional handling required to place and remove the sticker increases the chance that adjacent components on the PCB may become misaligned or damaged. Furthermore, the inadvertent failure to remove the sticker will cause the transducer to be substantially inoperative and will be perceived by the customer as a defective feature of the product.

In light of the above explanation, it is believed to be apparent that there is an existing need for a piezoelectric driven Helmholtz transducer which is fully compatible with standard PCB processing steps, i.e., it will not need special protective procedures.

SUMMARY OF THE INVENTION

It is a general object of the present invention to provide a piezoelectric driven Helmholtz resonator which can withstand the normal PCB wave soldering and cleaning operations without requiring special protective measures.

In a preferred embodiment of the transducer according to the present invention, a generally cylindrical Helmholtz chamber has a piezoelectric element comprising one end of the chamber and the other end of the chamber being comprised by an end wall. The cylindrical sidewall of the chamber includes at least two ports which are preferably disposed opposite each other. The transducer is designed to be mounted to a printed circuit board such that the end wall will be generally adjacent the PCB. The ports are contiguous with the internal surface of the end wall to facilitate the draining of a liquid from the Helmholtz chamber should such a liquid enter the chamber.

DESCRIPTION OF THE DRAWINGS

The same reference numbers are utilized in the different figures to indicate common elements.

DETAILED DESCRIPTION OF THE EMBODIMENTS

Figure 1:
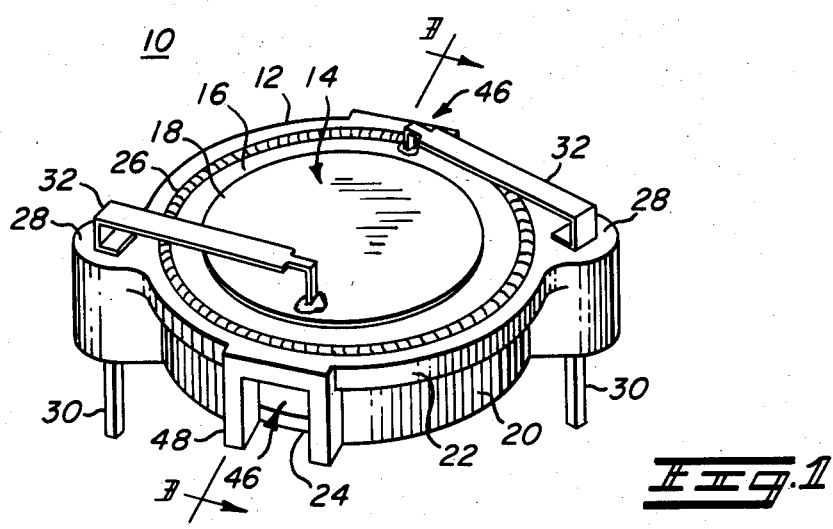
FIG. 1 is an isometric view of an embodiment of a transducer in accordance with the present invention.
Figure 3:
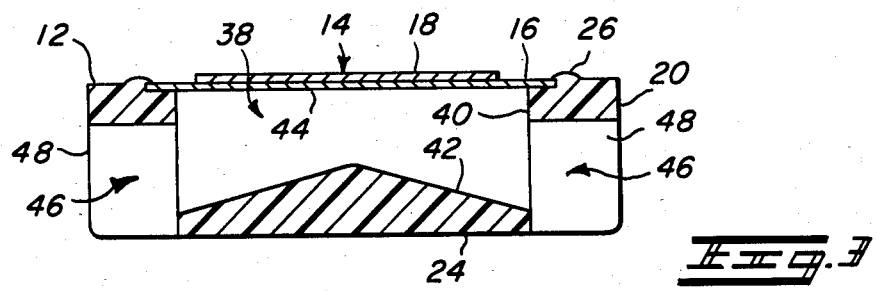
FIG. 3 is a cross sectional view taken along line 3—3 in FIG. 1.

Referring to FIGS. 1 and 3, a transducer 10 according to the present invention includes a plastic housing 12 and a piezoelectric element 14. The piezoelectric element 14 includes a diaphragm 16 and a disk 18 of piezoelectric material mounted to the diaphragm.

The housing 12 includes a substantially cylindrical sidewall 20 having an outwardly extending annular flange 22 at one end of the wall 20 and an end wall 24 which encloses the other end of wall 20. The periphery of diaphragm, 16 is secured to one end of cylindrical wall 20 by means of an upstanding deformable rim 26 which is deformed about the upper periphery of diaphragm 16 to captivate it to the housing. Of course, other mounting arrangements could be employed to secure the driving element to the housing.

Figure 2:
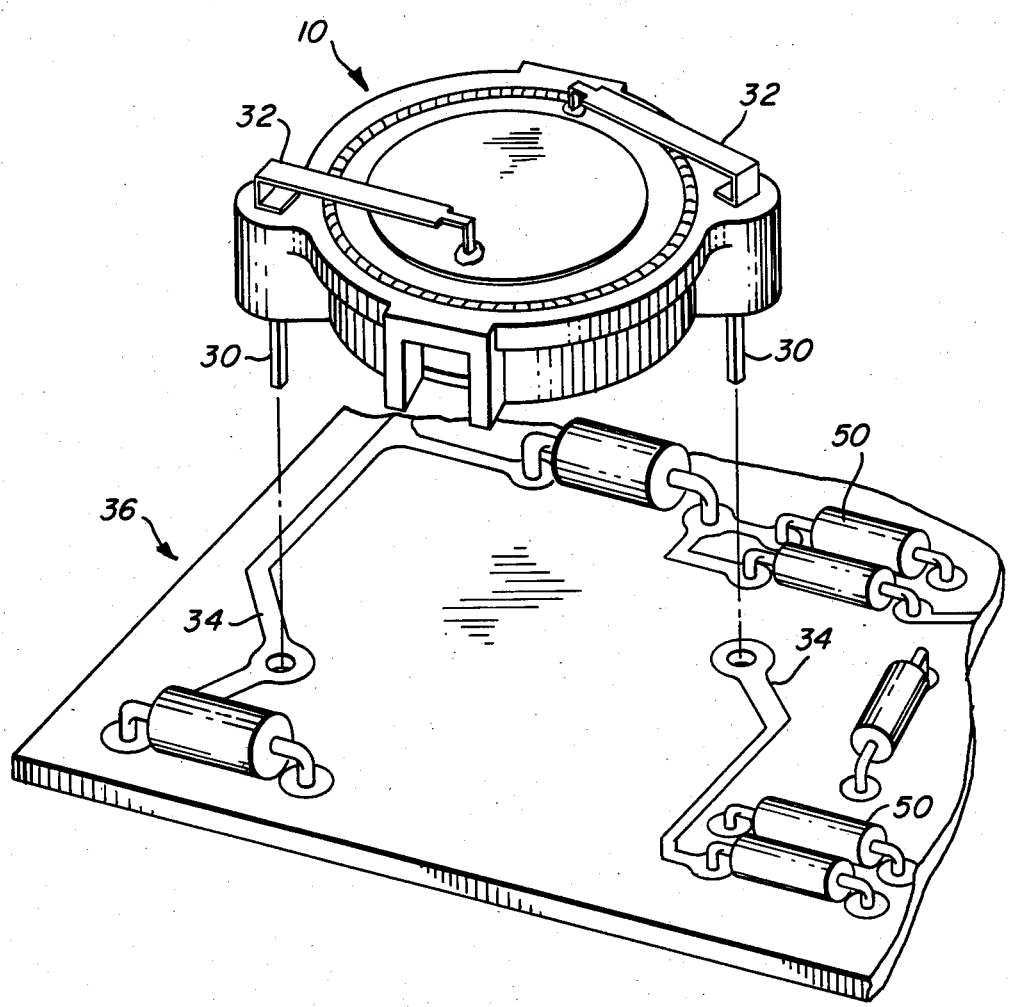
FIG. 2 is an exploded perspective view illustrating the transducer of FIG. 1 in position to be mounted to a printed circuit board.

The housing includes tabs 28 which have holes for receiving metal pins 30. Resilient conductive members 32 extend from one end to the pins 30 and are soldered at the other end to disk 18 and diaphragm 16, respectively. As best seen in FIG. 2, pins 30, which extend below the end wall 24, provide a convenient means for providing the necessary electrical connection between the piezoelectric element 12 and conductors 34 on printed circuit board (PCB) 36.

A Helmholtz chamber 38 is defined by the interior surface 40 of cylindrical wall 20, the interior surface 42 of end wall 24, and surface 44 of diaphragm 16.

Two ports 46 are disposed in opposition on cylindrical wall 20 and provide access to chamber 38. Radially projecting wall sections 48 may be utilized to extend the radial length of the ports. It should be noted that the ports, which are contiguous to both the end wall 24 and side wall 20, extend below the peripheral edge of surface 42 of end wall 24. Also, surface 42 is generally convex to facilitate the drainage of any liquid which may have entered chamber 38. Thus, end wall 24 and ports 46 are conducive to the drainage of liquids from chamber 38 which may have entered during the PCB cleaning process.

The natural resonant frequency of piezoelectric driver 14, the volume of Helmholtz chamber 38, and the volume enclosed by ports 46 will determine the frequency response of transducer 10. Since the particular frequency response of a transducer is a matter of design choice, the volumes of ports 46 and chamber 38 and the natural frequency response of piezoelectric element 14 should be selected accordingly.

FIG. 2 illustrates transducer 10 in its mounting relationship to PCB 36. When actually mounted to the PCB, the bottom surface of end wall 24 is substantially contiguous to the upper surface of PCB 36 and pins 30 are inserted into the corresponding holes surrounded by conductors 34. Components 50 are shown mounted to PCB 36 in general proximity of transducer 10.

The transducer 10 according to the present invention is typically mounted to PCB 36 at the same time components 50 are inserted onto the PCB. Once all of the components have been inserted, the assembled PCB carrying components 50 and transducer 10 can then be soldered in a single operation by passing the PCB over a conventional solder wave. The soldered PCB and transducer assembly is then immersed into a cleaning solution or the cleaning solution can be sprayed onto the assembled board. Normally the PCB after having been immersed in the cleaning liquid is passed below an "air knife" which consists of a jet of heated air which blows vigorously upon the PCB. Since the transducer 10 contains two ports, the air jet creates a pressure differential between the ports resulting in the flow of air into one port and out of the other port. This air flow through chamber 38 further aids in expelling any liquid which may have entered the chamber.

Figure 4:
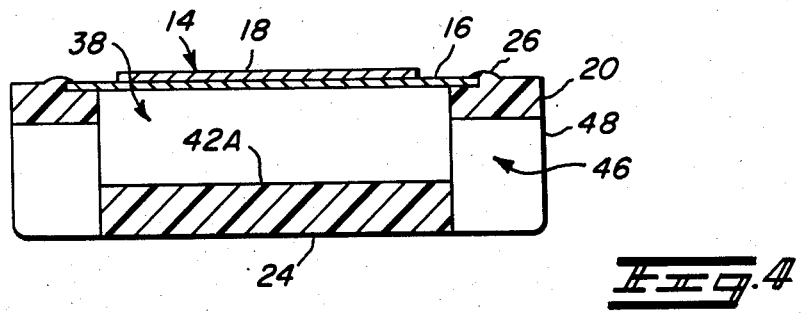
FIG. 4 is a cross sectional view of another embodiment of a transducer according to the present invention.

FIG. 4 is a cross sectional view of an alternative embodiment of a transducer which is identical to transducer 10 except that the inside surface 42A of end wall 24 is substantially planar. Although the planar surface 42A does not promote the same natural drainage as that caused by the convex shape of surface 42 as shown in FIG. 3, it has been found that the air flow into one port and out of the other port caused by the air knife is sufficient to adequately remove any residual cleaning liquid which may have remained within chamber 38 following immersion in the cleaning bath.

By utilizing at least two ports, the present Helmholtz chamber 38 does not develop a vacuum such as developed by the prior art resonators which utilize a single port. Thus, the difficulties encountered in extracting liquids and contaminates due to the developed vacuum in prior art devices are overcome.

Although two opposing ports have proved successful, other positions and mode than two of such ports could be employed. Furthermore, a Helmholtz resonator could be utilized in which a piezoelectric driving element comprises the bottom wall in the Helmholtz chamber. In such an embodiment, ports according to the present invention should be contiguous to the bottom (piezoelectric driver) wall to facilitate drainage.

Although embodiments of the present invention have been described and illustrated, the scope of this invention is defined by the claims appended hereto.

What is claimed is:

1. A method for manufacturing an assembly containing a printed circuit board (PCB) and a piezoelectric transducer comprising the steps of:

(a) mounting the piezoelectric transducer on the PCB, the transducer comprising a piezoelectric driver means for converting applied electric signals into mechanical vibrations which create sound, and Helmholtz resonator means coupled to said driver means for receiving the sound, said resonator means having a resonant chamber defined by bottom, top, and side walls, and at least two ports that provide access to said chamber, at least one of the ports disposed contiguous to both said bottom and side walls;

(b) wave soldering said PCB with said piezoelectric transducer mounted thereto;

(c) applying a cleaning liquid to the soldered assembly; and (d) causing any cleaning liquid disposed in said resonant chamber to flow out of said resonant chamber unimpeded by the presence of a vacuum since at least two ports in the chamber are provided.

2. The method according to claim 1 wherein step (d) comprises the step of creating a pressure differential between said ports by the application of a jet of air upon the assembly, thereby causing air to flow in one port and out of another port to aid in expelling any liquid from said chamber.

* * * * *